US007077236B2

(12) United States Patent
Sleboda et al.

(10) Patent No.: US 7,077,236 B2
(45) Date of Patent: Jul. 18, 2006

(54) ARTICULATING VEHICLE SPEAKER ASSEMBLY

(75) Inventors: Pawel W. Sleboda, Bloomfield Hills, MI (US); Richard D. George, Rochester Hills, MI (US); Justin Putti, Rochester Hills, MI (US)

(73) Assignee: Lear Corporation, Southfield, MI (US)

( * ) Notice: Subject to any disclaimer, the term of this patent is extended or adjusted under 35 U.S.C. 154(b) by 373 days.

(21) Appl. No.: 10/750,431

(22) Filed: Dec. 31, 2003

(65) Prior Publication Data

US 2005/0139413 A1 Jun. 30, 2005

(51) Int. Cl.
*H05K 5/02* (2006.01)
*H04B 1/03* (2006.01)
*H04R 5/02* (2006.01)
*H04R 1/02* (2006.01)

(52) U.S. Cl. ...................... 181/150; 381/389; 381/302; 381/387; 381/86

(58) Field of Classification Search ................ 181/150; 296/1.07; 381/389, 86, 302, 387
See application file for complete search history.

(56) References Cited

U.S. PATENT DOCUMENTS 3,719,250 A * 3/1973 Maekawa .................. 181/153
4,182,429 A * 1/1980 Senzaki ..................... 181/144
4,292,679 A * 9/1981 Kondo et al. .............. 367/188
4,441,577 A * 4/1984 Kurihara .................... 181/147
4,597,470 A * 7/1986 Takagi et al. .............. 181/141
4,601,361 A * 7/1986 Nakada ...................... 181/141
4,684,164 A * 8/1987 Durham ..................... 296/37.7
4,696,037 A * 9/1987 Fierens ...................... 381/300
5,133,428 A * 7/1992 Perrson ...................... 181/153
5,319,164 A * 6/1994 Shen .......................... 181/150
5,321,760 A 6/1994 Gray ........................... 381/86
5,822,023 A * 10/1998 Suman et al. ............... 348/837
5,838,537 A * 11/1998 Lundgren et al. ........... 361/683
5,859,917 A * 1/1999 Silber et al. ................ 381/389
5,960,095 A * 9/1999 Chang ........................ 381/387
6,078,497 A * 6/2000 Derocher et al. ........... 361/683
6,282,297 B1 * 8/2001 Lin ............................ 381/386
6,292,573 B1 * 9/2001 Zurek et al. ................ 381/386
6,343,135 B1 1/2002 Ellero et al. ................ 381/387
6,389,147 B1 * 5/2002 Rush et al. ................. 381/389
6,690,802 B1 * 2/2004 Stickles et al. ............... 381/86
2002/0097889 A1 7/2002 Makino ...................... 381/389
2003/0025045 A1 2/2003 Hinokio ..................... 248/27.1
2005/0069159 A1 * 3/2005 Nakazato .................... 381/306

* cited by examiner

*Primary Examiner*—Edgardo San Martin
(74) *Attorney, Agent, or Firm*—Bill Panagos

(57) ABSTRACT

An articulating speaker assembly for the interior of a motor vehicle, which includes sidewall trim defining a pocket in the trim, includes a housing and at least one speaker operatively supported within the housing. The assembly includes at least one pivot arm having first and second ends. The first end is operatively connected to the housing and defines a rotational axis, and the second end is attached to the vehicle and defines a pivotal axis. The at least one pivot arm is adapted to pivot about the pivotal axis to selectively move and position the housing at each point along a path between a retracted position wherein said housing is operatively supported within the pocket and aligned substantially flush with the sidewall trim such that the sidewall trim and the housing are substantially co-planar in the retracted position of the housing, and an extended position outside the pocket. The housing is adapted to rotate about the rotational axis such that the at least one speaker can be moved to a plurality of positions to selectively direct sound therefrom.

10 Claims, 3 Drawing Sheets

ARTICULATING VEHICLE SPEAKER ASSEMBLY

BACKGROUND OF THE INVENTION

1. Field of the Invention

The present invention relates, generally, to a speaker assembly for a motor vehicle and, more specifically, to such a speaker assembly that is articulately supported relative to the interior of the vehicle.

2. Description of the Related Art

In a passenger compartment of a motor vehicle, audio emanating from a sound system of the vehicle is directed typically from an interior panel into the passenger compartment and toward the general vicinity of the occupants of the vehicle. However, there are instances when it is desirable to direct the audio out of the passenger compartment and toward the exterior of the vehicle. This may be the case, for example, when the vehicle is associated with an entertainment event, such as a tailgating party, camping, while at the beach, and numerous other such events. In each of these cases, it may be desirable that the audio from a particular vehicle having an opened rear hatch or raised lift-gate, such as that of a sport-utility vehicle (SUV), be projected into the space exterior the vehicle toward bystanders positioned there. This allows the bystanders to hear the audio with much greater clarity and volume than would be possible using the typical vehicle sound-system arrangement. In addition, the quality of such audio would be increased even more with respect to the bystanders if the audio could be directed toward the bystanders no matter where they were located relative to the general vicinity of the rear of the vehicle.

However, a loudspeaker of a typical vehicle sound system is usually firmly fixed within the passenger compartment and positioned to emanate sound from the speaker into the passenger compartment only in a general direction. More specifically, the speaker is immovably mounted, for instance, in the door panel, the front- or rear-window ledge, or the sidewall trim of the passenger compartment. Also, the speaker is conventionally mounted flush with the surface of the respective door panel, window ledge, or sidewall trim. The sound emanates substantially in only a single, linear direction outward from the door panel or sidewall trim or upward from the window ledge. Since the position of the audience is often not in the path of the sound, the sound is of sub-optimal quality with respect to those located outside the vehicle.

This conventional arrangement for the speaker allows for more space in the passenger compartment for placement of other interior components and minimizes or eliminates view of the speaker by the driver and/or any other occupants of the vehicle. Unfortunately, however, this arrangement also results in less than optimal quality of the sound emanating from the speaker with respect to tailgaters, for instance, tailgating in a general area behind the vehicle who want to listen to, say, a pre-game show on the radio.

To better direct output of a vehicle speaker toward the occupant(s) of the vehicle, vehicle speaker systems have been mounted on top of the rear-window ledge such that they face forward toward the back of the occupant(s). A particular system of this type generally includes a speaker unit and a body for receiving the speaker unit. The speaker unit is adapted to move up and down with respect to the body, and the slant angle of the speaker unit is adapted to be changed elevationally. A driving source selectively drives the speaker unit. Thus, sound emitted from the speaker unit does not collide with a rear seat, in general, or a backrest or headrest of the rear seat, in particular, of a passenger compartment when the speaker system is mounted on the rear-window ledge.

Although suitable for its intended purpose, this speaker system suffers from several disadvantages. For instance, control over positioning of the speaker is limited. More specifically, orientation of the speaker unit is limited to elevational changes. Also, the speaker unit is highly conspicuous, which is undesirable for many vehicle-interior designs. Further, the speaker unit interferes with the driver's and/or any other occupant's view through the rear window (s).

To overcome these deficiencies, other vehicle speaker assemblies have permitted orientation of a speaker in accordance with an occupant's listening preferences and minimized the presence of the speaker when it is not in use. A typical assembly of this kind selectively rotates a ledge speaker from a retracted position under the ledge to an extended position above the ledge where the speaker is directed generally toward the vehicle occupants. There, the speaker can be rotated sideway to the right and/or left to direct sound to the ears of an occupant.

For example, U.S. Pat. No. 5,321,760 issued to John D. Gray on Jun. 14, 1994 discloses a retractable speaker assembly for an automobile that includes a housing in which is mounted a loudspeaker. The housing is mounted on a platform that is attached by trunnions to corresponding mounts. The mounts are secured to a window ledge of an automobile extending between a rear seat and a rear window of the automobile. The housing is capable of rotation about an axis extending through the center of the respective trunnions. Operation of a first actuator in the clockwise direction causes the platform and, thus, the housing to rotate upward about the axis from a retracted position to an extended position. Operation of the first actuator in the opposite direction causes the housing to rotate downward about the axis toward the retracted position. Sideway rotation of the housing is achieved by a second actuator mounted on the topside of the platform. The actuators are remotely controlled by the driver or another occupant of the automobile.

More specifically, the housing is coupled to a frame via the actuator mounted on the underside of the platform. The actuator has a spur gear mounted on a drive shaft of the actuator. The spur gear mates with teeth of a set of teeth formed on the frame. The set of teeth form an arc centered on the axis. Three of the four corners of the platform are supported by the trunnions and the spur gear. The fourth corner can be supported on a second frame member by a second spur gear that is mounted to the platform to freely rotate via teeth formed on the second frame member as the platform is extended or retracted using the actuator.

The housing is pivotally mounted to the platform via a shaft to enable the sideway (i.e., left/right) rotation of the housing, which is achieved by the second actuator. The second actuator has a plunger that is attached to a pivot pin, which is secured to the bottom of the housing. The plunger has at least three positions corresponding to left-facing, front-facing, and right-facing positions.

While the speaker assembly of the '760 patent overcomes some of the disadvantages of the related art, several shortcomings still remain. Most notably, the range of motion and the ability to adjust the primary direction of the audio output is limited. In particular, this speaker assembly is not adapted to direct audio out of the vehicle interior and toward the exterior of the vehicle such that the audio is projected into the space exterior the vehicle toward bystanders positioned there. Also, this speaker assembly is relatively structurally complex in design and, thus, relatively expensive to construct.

Accordingly, there remains a need in the related art for a speaker assembly that is adapted to direct audio over a wide predetermined range, including out of the vehicle interior and toward the exterior of the vehicle such that the audio is projected into the space exterior the vehicle toward bystanders positioned there. Furthermore, there is a need in the related art for a speaker assembly that is relatively structurally simple in design and, thus, relatively less expensive to construct.

SUMMARY OF THE INVENTION

The present invention overcomes the disadvantages in the related art in an articulating speaker assembly for the interior of a motor vehicle, which includes sidewall trim defining a pocket in the trim. The speaker assembly includes a housing and at least one speaker operatively supported within the housing. The assembly includes at least one pivot arm having first and second ends. The first end is operatively connected to the housing and defines a rotational axis, and the second end is fixedly attached to the vehicle and defines a pivotal axis. The pivot arm is adapted to pivot about the pivotal axis to selectively move and position the housing at each point along a path between a retracted position when the housing is operatively supported within the pocket and aligned substantially flush with the sidewall trim such that the sidewall trim and the housing are substantially co-planar, and an extended position outside the pocket. The housing is adapted to rotate about the rotational axis such that the at least one speaker can be moved to a plurality of positions to selectively direct sound therefrom.

One advantage of the articulating vehicle speaker assembly of the present invention is that it can direct audio over a wide predetermined range, including out of the rear interior and toward the exterior of the vehicle such that the audio is projected into the space exterior the vehicle toward bystanders positioned there.

Another advantage of the articulating vehicle speaker assembly of the present invention is that it is relatively structurally simple in design and, thus, relatively less expensive to construct.

Another advantage of the articulating vehicle speaker assembly of the present invention is that it can be easily integrated into a vehicle's interior component.

Another advantage of the articulating vehicle speaker assembly of the present invention is that it can be positioned within a side panel, interior trim, or door of a vehicle's interior component.

Another advantage of the articulating vehicle speaker assembly of the present invention is that the housing can be rotated into a desired position with or without use of a mechanical actuator.

Another advantage of the articulating vehicle speaker assembly of the present invention is that the housing can be positioned at any desired point along its path of movement.

Another advantage of the articulating vehicle speaker assembly of the present invention is that the housing can retract back into normal operating position for its standard operation.

Another advantage of the articulating vehicle speaker assembly of the present invention is that the housing can include multiple speakers.

Another advantage of the articulating vehicle speaker assembly of the present invention is that it results in lower costs and more efficient and effective use as compared to the vehicle-speaker assemblies of the related art.

DETAILED DESCRIPTION OF THE INVENTION

An articulating speaker assembly for a motor vehicle according to the present invention is generally indicated at 10 throughout the figures, where like numerals are used to designate like structure. Although the speaker assembly 10 is described below and shown in the figures used in connection with the interior of a motor vehicle in general, it may be adapted for such a vehicle having a cargo area, such as a van or sport-utility vehicle (SUV), in which its rear hatch can be opened or its lift-gate can be raised to emanate sound from the speaker assembly 10 toward the rear exterior of the vehicle. In this instance, the speaker assembly 10 is also adapted for particular use with a trim panel of the rear interior of the vehicle. However, those having ordinary skill in the art will appreciate that the speaker assembly 10 can be used in any suitable location within a vehicle interior, such as in the headliner, and in a vehicle interior of any suitable size.

Figure 1A:
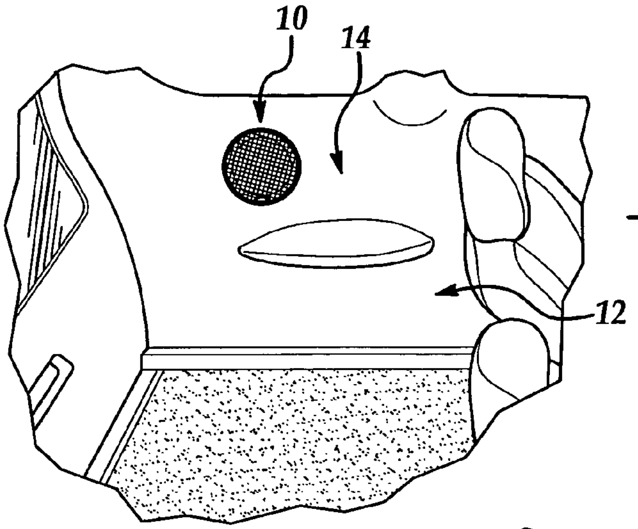
FIG. 1A is an environmental view of the articulating vehicle speaker assembly of the present invention shown in a retracted position in the rear right-trim panel of a vehicle.
Figure 1B:
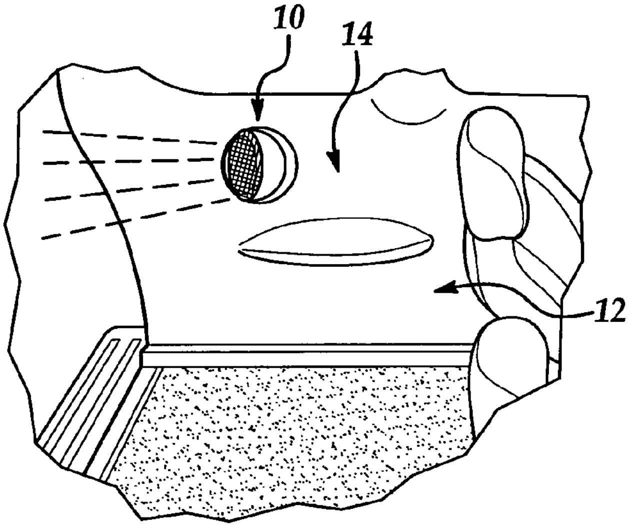
FIG. 1B is an environmental view of the articulating vehicle speaker assembly of the present invention shown in FIG. 1A in an extended position.

Referring now to FIGS. 1A and 1B, the interior, or, more specifically, the cargo area, of a motor vehicle is shown generally indicated at 12 and includes sidewall trim, generally indicated at 14. The sidewall trim 14 shown in FIGS. 1A and 1B includes a portion of the right rear-quarter panel of the interior 12. The cargo area 12 and sidewall trim 14 combine to define a substantially hemispherical pocket, generally indicated at 16, in each panel that is adapted to receive the speaker assembly 10, as described in greater detail below. In FIG. 1A, the speaker assembly 10 is shown in a retracted position in the right-trim panel. In FIG. 1B, the speaker assembly 10 is shown in an extended position in the right-trim panel. However, those having ordinary skill in the art will appreciate that the speaker assembly 10 can be used in each of the right- and left-trim panels or a plurality of speaker assemblies may be employed in the same panel.

Referring now to FIGS. 2 through 6, the speaker assembly 10 generally includes a housing 20 defining a cavity 22 within the housing 20 and at least one speaker, generally indicated at 24, operatively supported within the housing 20. The housing 20 is selectively movable along a path between a retracted position operatively supported within the pocket 16 and an extended position outside the pocket 16 wherein the at least one speaker 24 is directed toward the rear exterior of the motor vehicle. This functionality is illustrated in FIGS. 1A and 1B where the speaker 24 in FIG. 1B is shown in its extended position, and the speaker 24 in FIG. 1A is shown in its retracted position.

Figure 2:
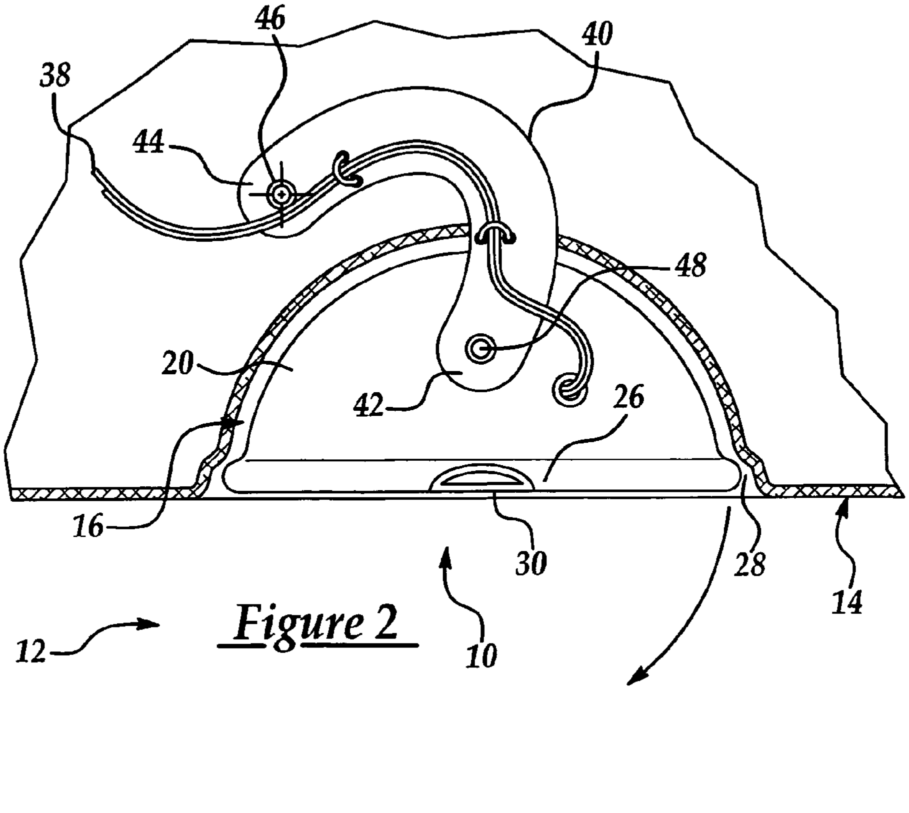
FIG. 2 is a top view of the articulating vehicle speaker assembly of the present invention shown in a retracted position.
Figure 3:
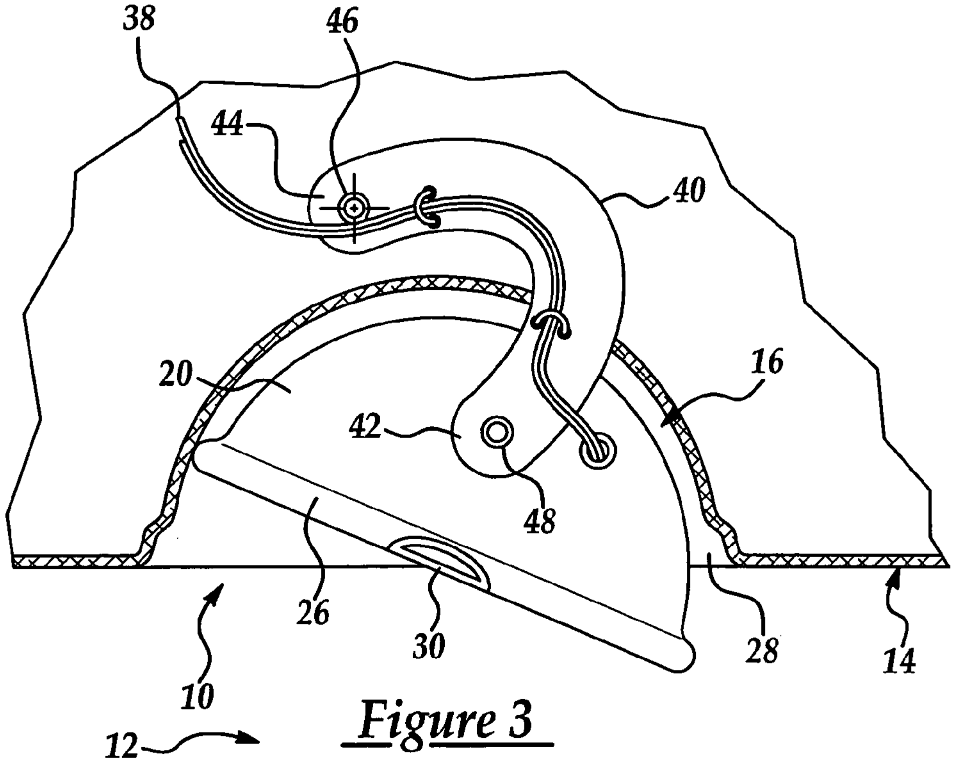
FIG. 3 is a top view of the articulating vehicle speaker assembly of the present invention shown in an extended position.
Figure 4:
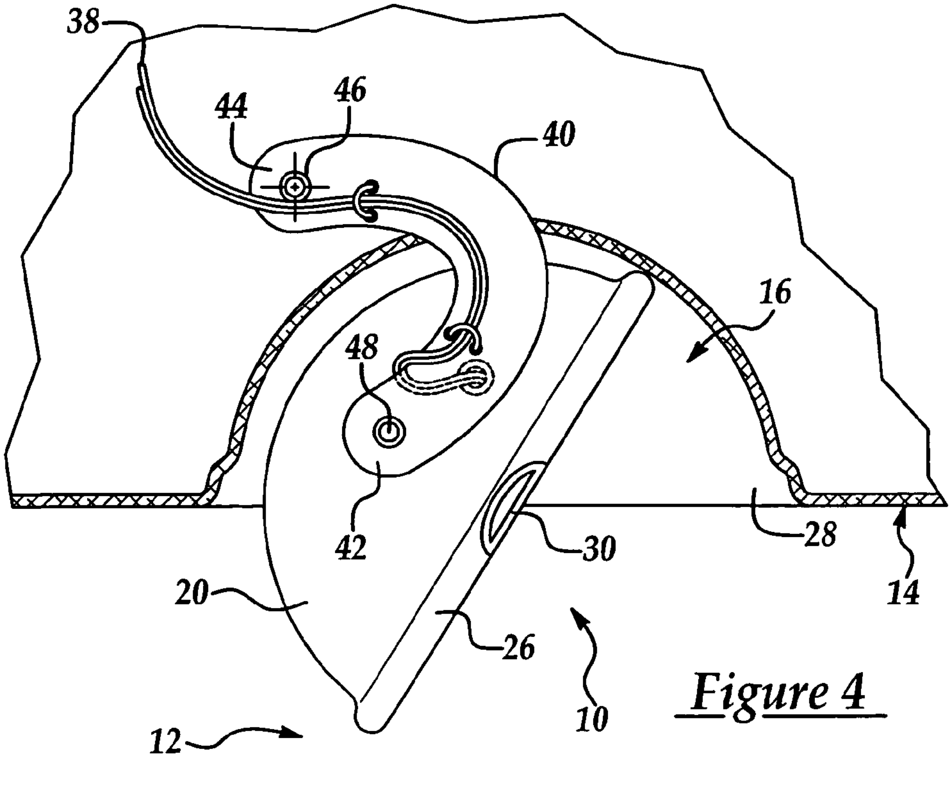
FIG. 4 is a top view of the articulating vehicle speaker assembly of the present invention shown in an extended position and the housing of the assembly rotated from the position of the housing shown in FIG. 3.
Figure 5:
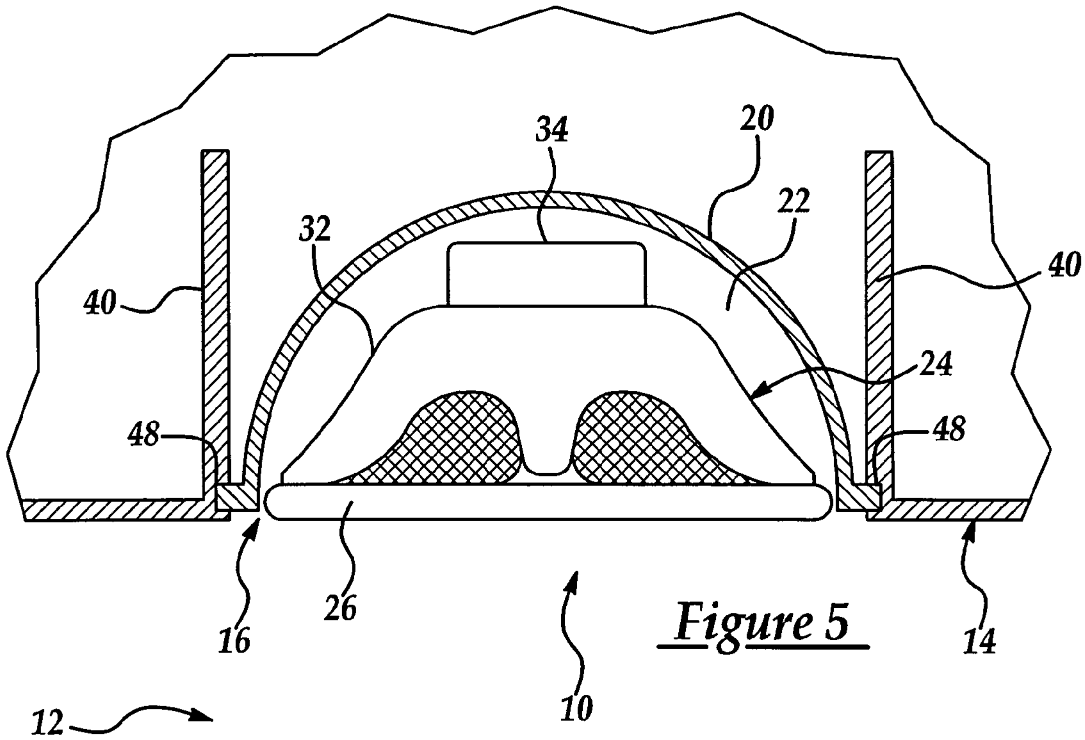
FIG. 5 is a side sectional view of the articulating vehicle speaker assembly of the present invention shown in a retracted position.

In a preferred embodiment of the speaker system 10 and as shown in FIGS. 2 and 5, the housing 20 is substantially hemispherical and adapted to be matingly received in the pocket 16 in the retracted position of the housing 20. As shown in FIG. 2, the hemispherical equator of the housing 20 defines a lip portion 26 adapted to be matingly received within a recess 28 defined by the sidewall trim 14 and the pocket 16. The lip portion 26 and, thus, the housing 20 are adapted to be aligned substantially flush with the sidewall trim 14 of the cargo area 12 such that the sidewall trim 14 and housing 20 are substantially co-planar in the retracted position of the housing 20. In this way, clearance between the housing 20 and the sidewall trim 14 is minimized in the retracted position of the housing 20 to prevent objects from falling into the pocket 16 and to present an acceptable class "A" surface when the speaker 24 is not deployed.

To operatively support the housing 20 within the pocket 16 in the retracted position of the housing 20, the housing 20 can include, by way of example only and not by way of limitation, a spring-loaded latch secured to the substantial rear of the housing 20 and the vehicle. More specifically, the speaker assembly 10 further includes an actuator 30 adapted to be actuated to selectively move the housing 20 along the path between the retracted position and the extended position of the housing 20. In this capacity, the housing 20 preferably includes either a tab or latch 30 disposed on the housing and adapted for manual actuation of the tab or latch 30. As shown in FIG. 2, the tab or latch can be disposed on the lip portion 26 so as to be easily accessible by a hand of an operator of the speaker assembly 10. However, it will be appreciated by those having ordinary skill in the art that the housing 20 can be operatively secured within the pocket 16 in the retracted position of the housing 20 by any suitable fastener(s) or other releasable restraining devices.

Those having ordinary skill in the art will appreciate that the housing 20 can have any suitable shape and size and structural relationship with the sidewall trim 14 and pocket 16 and within the cargo area 12 in the retracted and extended positions of the housing 20. It will also be appreciated that the speaker assembly 10 can include any suitable mechanism for access to the speaker 24 and the cavity 22 of the housing 20. It will further be appreciated that in the retracted and extended positions, the housing 20 can be suitably only partially disposed within the pocket 16 and cargo area 12, respectively.

In the preferred embodiment of the speaker assembly 10, the speaker 24 is any single suitable full-range speaker known in the art. More specifically, the speaker 24 can reproduce a full range of sounds, including bass, midlevel, and high. The speaker 24 can also include a plurality of speaker units, such as, but not limited to, a tweeter, midrange, and woofer.

Figure 6:
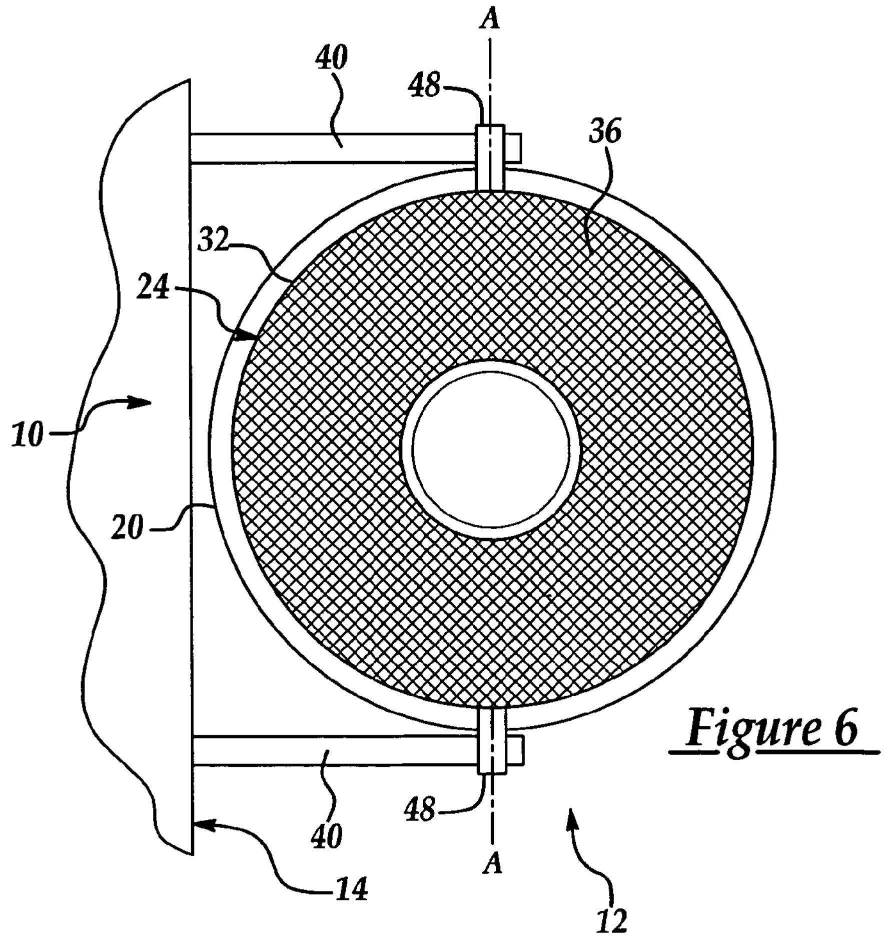
FIG. 6 is a side view of the articulating vehicle speaker assembly of the present invention shown in an extended position.

As shown in FIG. 5, the speaker 24 includes a cone unit 32 and a magnet unit 34 extending from a rear portion of the cone unit 32 toward the rear of the housing 20. The speaker 24 is disposed within the housing 20 such that the cone unit 32 is juxtaposed the cargo area 12 to define space between the rear of the speaker 24 and the rear of the housing 20. As shown in FIG. 6, the speaker 24 includes a grill 36 to protect the interior of the cone unit 32 and that can act as the front face of the housing 20. In this case, in the retracted position of the housing 20, the grill 36 is adapted to be aligned substantially flush with the sidewall trim 14 of the cargo area 12 such that the sidewall trim 14 and grill 36 are substantially co-planar. As shown in FIG. 2, the speaker 24 also includes a wire 38 extending from the substantial top of the cone unit 32 for operative connection to a source of power.

In the preferred embodiment of the speaker assembly 10 and as shown in FIGS. 2 through 6, the speaker assembly 10 also includes at least one pivot arm 40 operatively connected to the housing 20. More preferably and as shown in FIGS. 5 and 6, the speaker assembly 10 includes a pair of pivot arms 40 operatively connected to the housing 20 in opposed relation to each other. In particular, one of the pivot arms 40 is operatively connected to the substantial top of the housing 20 and the other pivot arm 40 is operatively connected to the substantial bottom of the housing 20.

Each pivot arm 40 also defines a pivotal axis "+," as shown directed substantially perpendicular into the page of FIG. 2, extending substantially vertically through the pivot arm 40 and about which the pivot arm 40 is adapted to pivot to move the housing 20 along the path between the retracted and extended positions of the housing 20. Each pivot arm 40 further has first and second ends 42, 44, respectively. The pivot arm 40 is operatively connected to the housing 20 at the first end 42, and the pivotal axis "+" is defined at the second end 44. The second end 44 also defines a pivotal point of the pivotal axis "+" that is fixedly attached to the vehicle. As shown in FIG. 2, a pivoting member 46 can define the pivotal point and be fixedly attached to a frame (not shown) of the vehicle.

Preferably and as shown in FIG. 2, each pivot arm 40 is substantially curved such that the path along which the housing 20 is selectively movable between its retracted and extended positions is curved, as shown by the arrow in FIG. 2. More preferably, the housing 20 is adapted to be moved about the pivotal axis substantially 90° along the path such that the face of the speaker 24 is disposed substantially in the direction of the rear of the vehicle in the extended position of the housing 20.

Those having ordinary skill in the art will appreciate that the housing 20 can be moved by any suitable structure(s), such as by a hinge or hinges (not shown). Those having ordinary skill in the art will also appreciate that such structure can be fixedly attached to any suitable part of the vehicle by any suitable means. Those having ordinary skill in the art will further appreciate that the housing 20 can move along its path of movement any suitable number of degrees.

In the preferred embodiment of the speaker assembly 10 and as shown in FIG. 6, the housing 20 further defines a rotational axis "A" extending substantially vertically through the housing 20 and about which the housing 20 is adapted to rotate when it is disposed in any one of its extended positions. In this way, the speaker 24 can be moved to a plurality of positions to direct sound from the speaker toward any area selected by the operator and notably toward the exterior to the rear of the vehicle. As shown in FIG. 2, a rotational member 48 can define the rotational point and be fixedly attached to the housing 20. As shown in FIG. 6 and in the preferred embodiment illustrated here, the rotating members are a pair of short, cylindrical nubs 48 defined on the housing 20 and extending substantially outwardly from the housing 20 in opposite directions from each other. In addition, each corresponding pivot arm 40 defines an aperture through which the respective nub 48 can be matingly received. The nubs 48 are aligned with respect to each other along the rotational axis "A." Preferably, the housing 20 is adapted to rotate about the rotational axis "A" in a range including 0° to 360°.

In operation and as shown in FIGS. 2 and 5, the housing 20 is in its retracted position. Upon manual activation of the housing 20 or use of the mechanical actuator, the housing 20 moves to its extended position. The pivot arms 40 allow for the housing 20 to be extendable or retractable relative to the pocket 16. More specifically, the housing 20 may be movable from the retracted position to the extended position by manually pivoting the housing 20, as shown by the arrow in FIG. 2, so that the speaker 24 is exposed toward the rear of the vehicle. The speaker 24 is operable at any point along the path of movement of the housing 20, including the retracted and extended positions of the housing 20.

The speaker assembly 10 may also be installed at or adjusted to a particular angle in both the retracted and extended positions to provide optimum sound when the speaker assembly 10 is in operation. Preferably, the pivot arm 40 allows positioning of the housing 20 at any location between the side- and rear-facing positions. Of course, the particular direction and degree of pivot and rotation can be selected as desired for a particular application. Furthermore, if desired, rotation of the housing 20 can be disabled until the housing 10 is at least partially extended from its retracted position.

As can easily be seen from the above description, the speaker assembly 10 can direct audio out of the cargo area 12 and toward the exterior of the vehicle such that the audio is projected into the space exterior the vehicle toward bystanders positioned there. The speaker assembly 10 also is relatively structurally simple in design and, thus, relatively less expensive to construct. Further, it can be integrated into a vehicle's interior component and, more particularly, positioned within a side panel, interior trim, or door of the interior component. In addition, the housing 20 of the speaker assembly 10 can be moved into a desired position with or without use of a mechanical actuator, be positioned at any desired point along the path of its movement, retract back into normal operating position for its standard operation, and include multiple speakers. Moreover, the speaker assembly 10 results in lower costs and more efficient and effective use as compared to the vehicle-speaker assemblies of the related art.

The present invention has been described in an illustrative manner. It is to be understood that the terminology that has been used is intended to be in the nature of words of description rather than of limitation. Many modifications and variations of the present invention are possible in light of the above teachings. Therefore, within the scope of the appended claims, the present invention may be practiced other than as specifically described.

What is claimed is:

1. An articulating speaker assembly for the interior of a vehicle that includes sidewall trim defining a pocket in said trim, said articulating speaker assembly comprising:

a housing; and at least one speaker operatively supported within said housing;

said assembly including at least one pivot arm having first and second ends, said first end being operatively connected to said housing and defining a rotational axis and said second end being attached to the vehicle and defining a pivotal axis, said at least one pivot arm being adapted to pivot about said pivotal axis to selectively move and position said housing at each point along a path between a retracted position wherein said housing is operatively supported within the pocket and aligned substantially flush with the sidewall trim such that the sidewall trim and said housing are substantially coplanar, and an extended position outside the pocket, said housing being adapted to rotate about said rotational axis such that said at least one speaker can be moved to a plurality of positions to selectively direct sound therefrom.

2. An articulating speaker assembly as set forth in claim 1, wherein said second end defines a pivotal point of said pivotal axis that is attached to the vehicle.

3. An articulating speaker assembly as set forth in claim 1, wherein said housing includes at least one rotational member defining said rotational axis of said housing and rotatably connecting said housing to said first end of said at least one pivot arm.

4. An articulating speaker assembly as set forth in claim 3, wherein said at least one pivot arm includes a pair of pivot arms operatively connected to said housing in opposed relation to each other.

5. An articulating speaker assembly as set forth in claim 4, wherein said housing includes at least a pair of rotating members rotatably connected to a corresponding one of said pair of pivot arms, said pair of rotating members extending outwardly from said housing in opposite directions from each other.

6. An articulating speaker assembly as set forth in claim 5, wherein each of said pair of pivot arms defines an aperture through which the respective said rotating member is matingly received.

7. An articulating speaker assembly as set forth in claim 1, wherein said at least one pivot arm is substantially curved such that said path along which said housing is selectively movable between said retracted position and said extended position is curved.

8. An articulating speaker assembly as set forth in claim 1, wherein said pivot arm is adapted to pivot about said pivotal axis substantially 90°.

9. An articulating speaker assembly as set forth in claim 1, wherein said housing is adapted to rotate about said rotational axis substantially 360°.

10. An articulating speaker assembly as set forth in claim 1, wherein said speaker assembly further includes an actuator adapted to be actuated to selectively move said housing along said path between said retracted position and said extended position.

* * * * *